United States Patent
Hossain et al.

(10) Patent No.: US 12,125,601 B2
(45) Date of Patent: Oct. 22, 2024

(54) ENHANCED SURFACE TREATMENTS

(71) Applicant: Cerium Laboratories LLC, Austin, TX (US)

(72) Inventors: Timothy Hossain, Austin, TX (US); Clayton Fullwood, Austin, TX (US)

(73) Assignee: Cerium Laboratories, LLC, Austin, TX (US)

( * ) Notice: Subject to any disclaimer, the term of this patent is extended or adjusted under 35 U.S.C. 154(b) by 682 days.

(21) Appl. No.: 16/879,702

(22) Filed: May 20, 2020

(65) Prior Publication Data

US 2020/0279661 A1 Sep. 3, 2020

Related U.S. Application Data

(63) Continuation of application No. 15/146,388, filed on May 4, 2016, now Pat. No. 10,777,328.

(60) Provisional application No. 62/190,111, filed on Jul. 8, 2015, provisional application No. 62/156,697, filed on May 4, 2015.

(51) Int. Cl.
*G21C 3/07* (2006.01)

(52) U.S. Cl.
CPC ................ *G21C 3/07* (2013.01); *Y02E 30/30* (2013.01)

(58) Field of Classification Search
CPC .................................. G21C 3/07; Y02E 30/30
USPC ............. 60/722; 415/177; 376/457; 428/428
See application file for complete search history.

(56) References Cited

U.S. PATENT DOCUMENTS

| | | | |
|---|---|---|---|
| 2003/0215642 A1* | 11/2003 | Carre | C03C 17/3441 428/428 |
| 2011/0203281 A1* | 8/2011 | Sarrafi-Nour | C04B 41/89 60/722 |
| 2015/0044037 A1* | 2/2015 | Bucking | F02C 6/12 415/177 |

* cited by examiner

*Primary Examiner* — Bo Fan

(57) ABSTRACT

A turbine includes a central hub to rotate around an axis and a plurality of blades connected to the central hub. Each blade of the set of blades includes a support material having an exterior facing surface and a ceramic nitride coating disposed over the exterior facing surface. The ceramic nitride coating includes a semi-metal nitride, such as silicon nitride. The ceramic nitride coating can have a thickness in a range of 50 nm to 5 micrometers. A rough material layer can be disposed between the support material and the ceramic nitride coating.

13 Claims, 3 Drawing Sheets

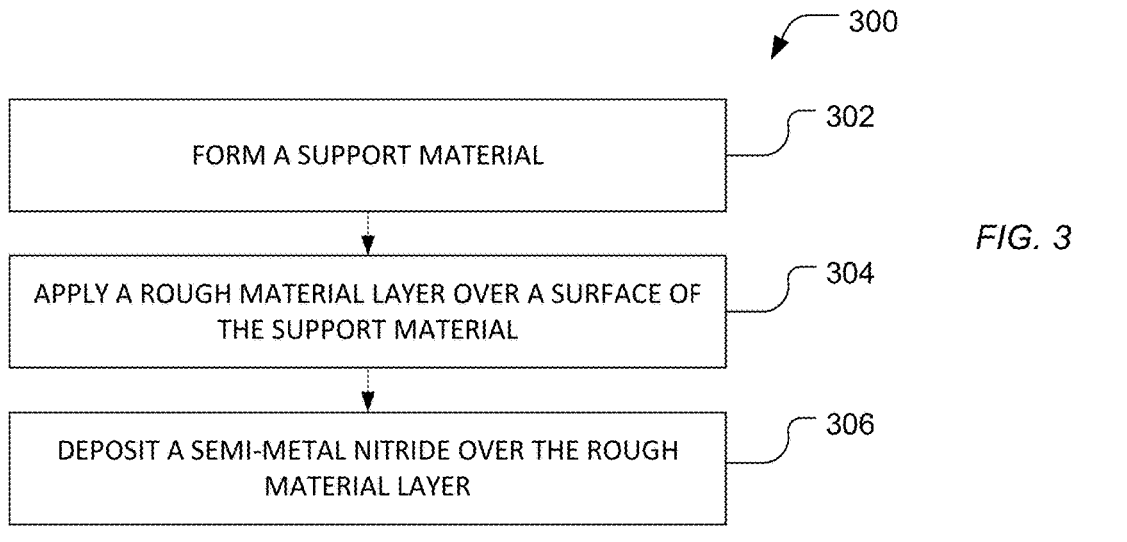
FIG. 3
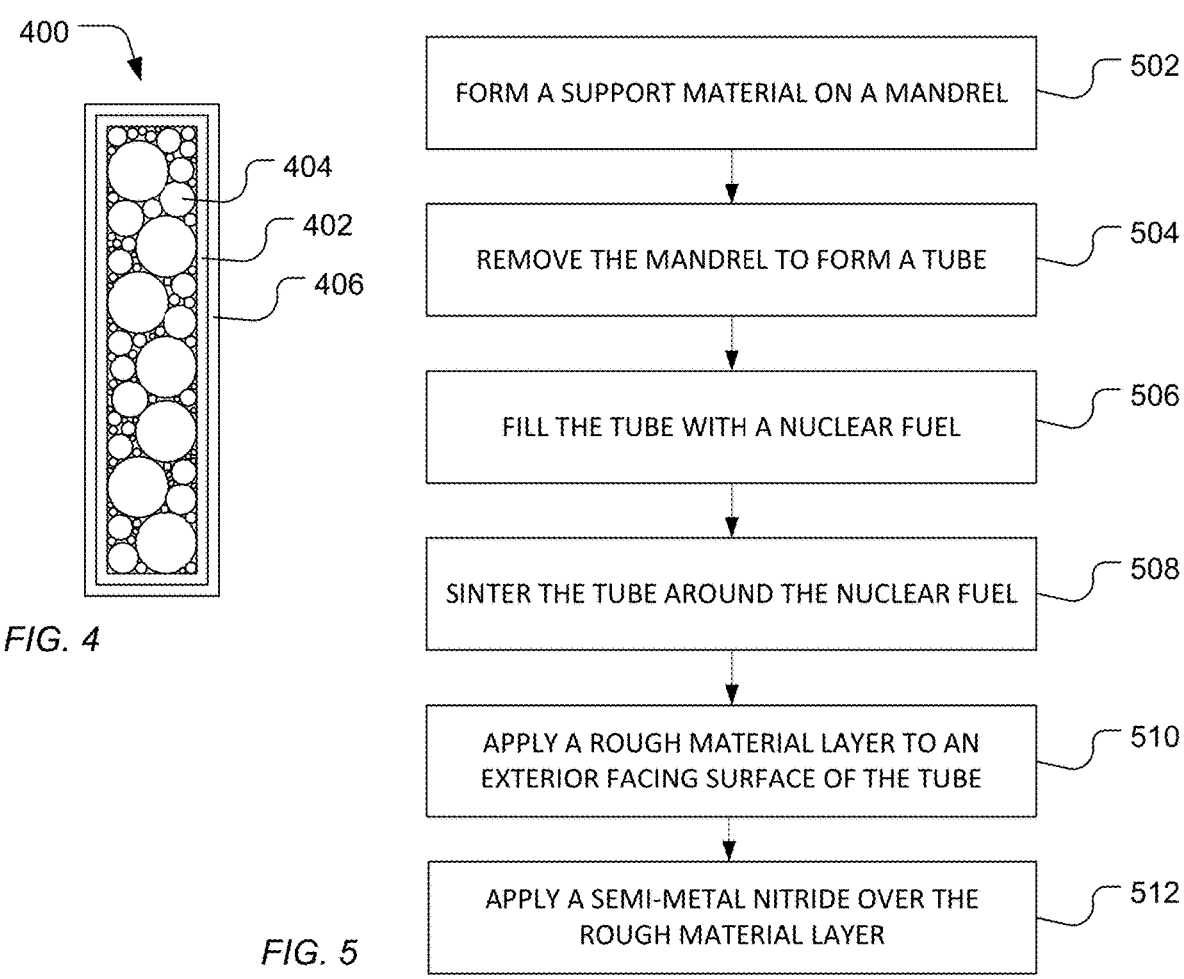
FIG. 4
FIG. 5

ENHANCED SURFACE TREATMENTS

CROSS-REFERENCE TO RELATED APPLICATION(S)

The present application is a continuation of U.S. application Ser. No. 15/146,388, entitled "ENHANCED SURFACE TREATMENTS" filed May 4, 2016, which claims benefit of U.S. Provisional Patent Application No. 62/156,697, entitled "ENHANCED SURFACE TREATMENTS" filed on May 4, 2015 and which claims benefit of U.S. Provisional Patent Application No. 62/190,111, entitled "ENHANCED SURFACE TREATMENTS" filed on Jul. 8, 2015, the entirety of each of which is herein incorporated by reference.

FIELD OF THE DISCLOSURE

This disclosure, in general, relates to enhanced surface treatments formed of semi-metal nitride, methods of making same, apparatuses using same, and methods of using such apparatuses.

BACKGROUND

In industries as diverse as the nuclear industry, the transportation industry, or the shipping industry, exterior surfaces of vehicles, containers, or structures are exposed to harsh environments. Such harsh environments can cause physical or chemical changes to the exterior surfaces, impacting the functionality associated with that surface or the integrity the underlying structure. For example, degradation of the exterior surfaces on vehicles can affect roughness of the surface, resulting in increased friction and reduced energy efficiency. In another example, chemical changes in the exterior surface of a container can lead to degradation of the structural integrity of the underlying support material.

As such, a surface treatment that protects the physical or chemical nature of a surface or its associated support material would be desirable.

BRIEF DESCRIPTION OF THE DRAWINGS

The present disclosure may be better understood, and its numerous features and advantages made apparent to those skilled in the art by referencing the accompanying drawings.

FIG. 3 includes a flow diagram illustrating an exemplary method of treating a surface.

FIG. 4 includes an illustration of an exemplary fuel rod.

FIG. 5 includes a flow diagram illustrating an exemplary method of forming a fuel rod.

The use of the same reference symbols in different drawings indicates similar or identical items.

DETAILED DESCRIPTION

In an exemplary embodiment, an apparatus includes a support material defining an exterior facing surface. A non-oxide ceramic, such as a ceramic nitride, is disposed over the exterior facing surface of the support material. In another example, the ceramic is an oxynitride disposed over the exterior facing surface. Alternatively, the ceramic nitride can be disposed over an interior facing surface, for example, of a container. In an example, the exterior facing surface of the support material has a roughness (Ra) in a range of 10 nm to 30 μm. The support material can include aluminum, a transition metal, alloys thereof, or a combination thereof. In an example, the ceramic nitride includes a transition metal or semi-metal nitride. For example, the transition metal nitride can include titanium nitride. In another example, the semi-metal nitride includes silicon nitride. In a further example, the ceramic can include an oxynitride ceramic, such as an aluminum oxynitride. Optionally, a rough material layer can be disposed between the exterior facing surface of the support material and the semi-metal nitride. In an example, the rough material layer is crystalline. In another example, the rough material layer is amorphous. In another example, the rough material layer has a thickness in a range of 10 nm to 1 μm and can have a roughness (Ra) in a range of 10 nm to 1 μm. In particular, the rough material layer can include a ceramic, such as the zirconia, for example, yttria-stabilized zirconia.

Such an apparatus can be formed by applying a rough material layer to the surface of a support material. The rough material layer can have a thickness in a range of 10 nm to 1 μm and can have a roughness (Ra) in a range of 10 nm to 1 μm. The rough material layer can be deposited using chemical vapor deposition (CVD) or sputtering. The rough material layer can be crystalline. A non-oxide ceramic, such as a transition metal or semi-metal nitride, is deposited over the rough material layer. In another example, an oxynitride can be deposited over the rough material layer. For example, the transition metal or semi-metal nitride or oxynitride can be deposited using CVD or sputtering. In an example, the semi-metal nitride includes silicon nitride. In another example, the transition metal nitride includes titanium nitride. In an example, the oxynitride includes aluminum oxynitride.

Figure 1:
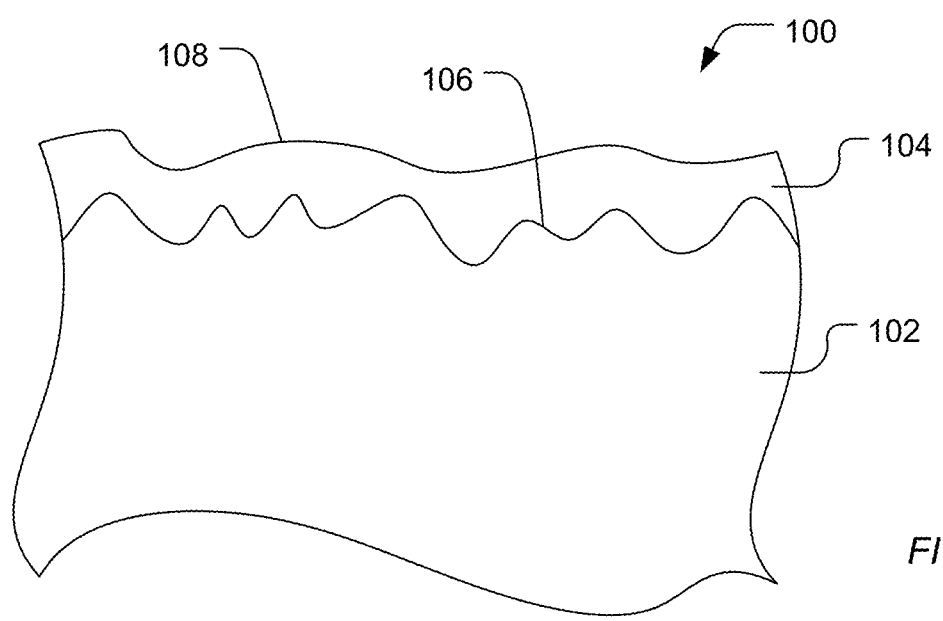
FIG. 1 and FIG. 2 include illustrations of exemplary surface portions of an apparatus.

In an example illustrated in FIG. 1, a support material 102 defines an exterior facing surface 106. A non-oxide ceramic, such as a ceramic nitride or oxynitride 104, is deposited over the exterior facing surface 106 and defines an exterior facing surface 108. Alternatively, the ceramic nitride can be disposed over an interior facing surface, for example, of a container defined by the support material 102.

The exterior facing surface 106 can have a roughness (Ra) in a range of 10 nm to 30 μm. For example, the roughness (Ra) can be in a range of 10 nm to 25 μm. In a particular example, the roughness (Ra) can be in a range of 10 nm to 1 μm, such as a range of 10 nm to 500 nm, or a range of 50 nm to 350 nm. In another example, the roughness (Ra) of the exterior facing surface is in a range of 5 μm to 25 μm, such as a range of 10 μm to 25 μm, or a range of 15 μm to 25 μm.

In an example, the ceramic nitride or oxynitride 104 defines a surface 108 above the surface 106 and has a reduced roughness (Ra). In particular, the roughness (Ra) of the surface 108 can be not greater than 50% of the roughness of the surface 106, such as not greater than 40%, not greater than 30%, or even not greater than 25% of the roughness (Ra) of the surface 106. In a particular example, the roughness (Ra) of the surface 108 is at least 0.1% of the roughness of the surface 106.

In a particular example, the ceramic nitride or oxynitride 104 forms a chemical bond with the underlying layer. The chemical bond can be a covalent bond or a can be Van der Waals or ionic in nature. In particular, the chemical bond is a covalent bond.

Figure 2:
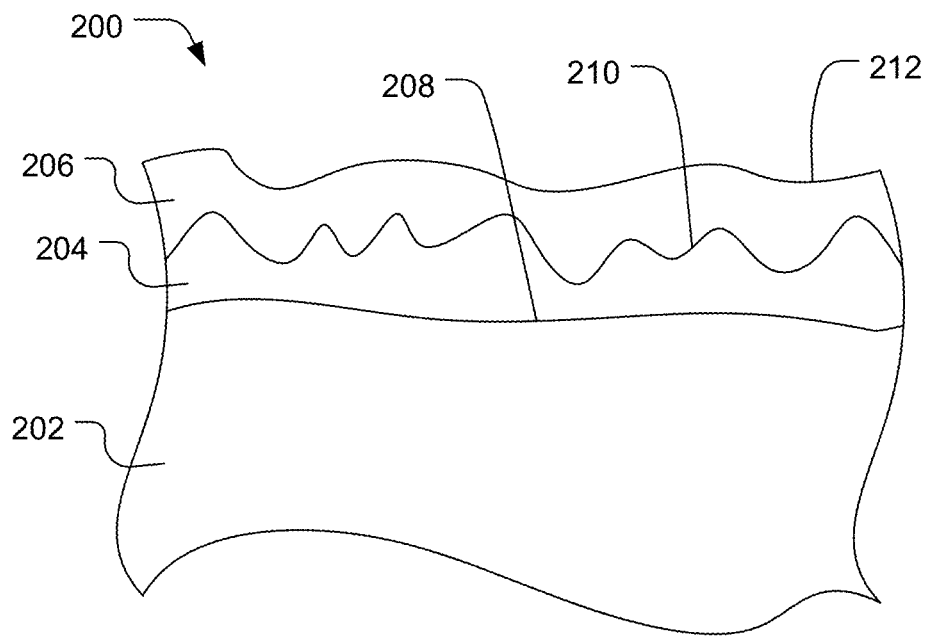

The surface 106 can form the surface of a support material. In another example, the exterior facing surface 106 can be formed of a rough material deposited over the support material. For example, as illustrated at FIG. 2, a material 204 defining a rough surface 210 can be deposited over a support material 202 defining exterior facing surface 208. A ceramic nitride or oxynitride layer 206, such as a transition metal nitride or semi-metal nitride or oxynitride, can be deposited over the surface 210 and define a further exterior facing surface 212. Additional exterior layers (not illustrated) formed of metal, ceramic, or polymeric materials can be formed over the surface 212.

The support material 202 can be formed of aluminum, a transition metal, alloys thereof, or a combination thereof. In an example, the transition metal is titanium, zirconium, hafnium, tin, niobium, iron, chromium, nickel, tantalum, tungsten, manganese, cobalt, copper, zinc, alloys thereof, or a combination thereof. In a particular example, the support material includes zirconium, tin, niobium, iron, chromium, nickel, hafnium, alloys thereof, or a combination thereof. For example, the support material 202 can be a zirconium alloy. In an example, the zirconium alloy includes Zircaloy. In another example, the support material 202 includes steel.

The material layer 204 disposed between the exterior facing surface 208 of the support material 202 and the transition metal or semi-metal nitride or oxynitride 206 can be a crystalline material. In another example, the rough material layer 204 can be amorphous. In a particular example, the rough material layer 204 includes a ceramic material. For example, the ceramic material can be a transition metal oxide. In a particular example, the transition metal ceramic includes zirconia, such as yttria-stabilized zirconia. In a further example, the transition metal ceramic can be an oxide of chromium, an oxide of tantalum, an oxide of hafnium, or an oxide of titanium. In another example, the ceramic material can include alumina. In a further example, the ceramic material can include silica.

The rough material layer 204 can have a thickness in a range of 50 nm to 5 μm. For example, the thickness can be in a range of 50 nm to 1 μm, such as a range of 50 nm to 500 nm, or a range of 50 nm to 250 nm. The surface 210 of the rough material layer 204 can have a roughness (Ra) in a range of 10 nm to 1 μm, such as a range of 10 nm to 500 nm, or a range of 50 nm to 350 nm.

The ceramic nitride or oxynitride 206 can be a nitride or oxynitride formed of a transition metal, such as zirconium, scandium, yttrium, vanadium, chromium, niobium, tantalum, copper, tungsten, zinc, iron, titanium, or a combination thereof, or a semi-metal such as silicon, gallium, germanium, aluminum, boron, indium, or a combination thereof. In an example, the transition metal nitride can include yttrium nitride, titanium nitride, tantalum nitride, scandium nitride, chromium nitride, vanadium nitride, zirconium nitride, or a combination thereof. In particular, the transition metal nitride can be yttrium nitride, vanadium nitride, titanium nitride, chromium nitride, or a combination thereof. In particular, the transition metal nitride can be titanium nitride. In an example, the semi-metal nitride can be a boron nitride, silicon nitride, gallium nitride, germanium nitride, aluminum nitride, indium nitride, or a combination thereof. In a particular example, the semi-metal nitride includes silicon nitride.

In a further example, the ceramic oxynitride includes aluminum oxynitride. For example, the aluminum oxynitride can have the formula $(Al_2O_3)_{1-x}(AlN)_x$ where x is in a range of 0.1 to 0.9.

In an example, the ceramic nitride or oxynitride 206 can have a natural abundance of nitrogen isotopes. In another example, the ceramic nitride or oxynitride 206 can be enriched in a select isotope of nitrogen, for example, $^{15}N$. In particular, the ceramic nitride or oxynitride 206 can be enriched to include 2% to 99.99% $^{15}N$ expressed as a percentage of the nitrogen atoms. For example, the enriched ceramic nitride or oxynitride can include 2% to 20% $^{15}N$, such as 3% to 20% $^{15}N$. In another example, the enriched ceramic nitride or oxynitride can include 80% to 99.99% $^{15}N$.

In an example, the ceramic nitride or oxynitride 206 is amorphous, semi-crystalline, or crystalline. In a particular example, the ceramic nitride 206 is amorphous, such as an amorphous silicon nitride. In another example, the ceramic nitride or oxynitride is crystalline, such as an aluminum nitride, aluminum oxynitride, gallium nitride, or transition metal nitride.

The ceramic nitride or oxynitride 206 can have a thickness in a range of 50 nm to 10 μm. For example, the thickness of the ceramic nitride or oxynitride 206 can be in a range of 50 nm to 5 μm, such as a range of 50 nm to 1 μm, a range of 50 nm to 500 nm, or a range of 50 nm to 250 nm. In an example, the roughness (Ra) of the surface 212 defined by the nitride or oxynitride 206 can have a roughness that is not greater than 50% of the roughness of the surface 210. For example, the roughness (Ra) of the surface 212 can be not greater than 40%, such as not greater than 30%, or even not greater than 25% of the roughness (Ra) of the surface 210. In a particular example, the roughness (Ra) of the surface 212 is at least 0.1% of the roughness of the surface 210.

In a particular example, the ceramic nitride or oxynitride 206 forms a chemical bond with the underlying material 204. The chemical bond can be covalent, Van der Waals or ionic in nature. In particular, the chemical bond is a covalent bond.

As illustrated in FIG. 3, a method 300 includes forming a support material to define an exterior facing surface, as illustrated at 302. For example, a support material can take the form of a panel that is shaped to suit its intended use. In another example, the support material can be formed around a mandrel to define a tube. In particular, the support material can have the composition of the support materials described above.

Optionally, as illustrated at 304, a rough material layer can be deposited over an exterior facing surface of the support material. For example, the rough material layer can be deposited using chemical vapor deposition (CVD). In another example, the rough material layer can be deposited using sputtering. When applied, the rough material layer can have a composition, thickness and roughness (RA) as described above.

As illustrated at 306, a ceramic nitride or oxynitride can be deposited over the exterior facing surface of the support material and optionally over the rough material layer. For example, the ceramic nitride can be deposited using chemical vapor deposition (CVD). In an example, the chemical vapor deposition can include atmospheric pressure CVD, low-pressure CVD, ultra low-pressure CVD, flowable CVD, plasma enhanced CVD, or atomic layer CVD. In particular, the chemical vapor deposition can include low-pressure CVD, flowable CVD, or plasma enhanced CVD. The CVD can be performed without self-limiting precursors. For example, the nitride or oxynitride can be deposited using an organo metal or semi-metal, nitrogen, and optionally oxygen for oxynitrides. In a particular example, the support material can be seeded with a surface treatment, for example, ammonia, followed by growth of the ceramic nitride or oxynitride using CVD. In particular, the CVD process can be repeated between 1 and 8 times to provide a desired layer thickness or to provide layers of different composition. In another example, the ceramic nitride can be deposited using sputtering. The ceramic nitride or oxynitride can have a composition or thickness as described above and a reduced roughness relative to the surface of the support material or rough material layer. Alternatively, the ceramic nitride or oxynitride can be disposed over an interior facing surface, for example, of a container formed of the support material.

In a particular example illustrated in FIG. 4, surface treatment can be utilized on a nuclear fuel rod. For example, a nuclear fuel rod 400 includes a container formed of a support material 402 surrounding a nuclear fuel 404. A ceramic nitride layer 406 can be disposed over the exterior facing surface of the support material 402. In particular, the support material 402 can be formed of a transition metal alloy, such as a zirconium alloy, for example, including zirconium and one or more of tin, niobium, iron, chromium, nickel, hafnium or combinations thereof. For example, the zirconium alloy can be a Zircaloy.

The surface can be roughened by, for example, oxidizing the surface to form zirconia crystals. In another example, a rough material layer can be deposited, such as a compatible ceramic material. A compatible ceramic material adheres to the zirconium alloy without delaminating or causing further chemical degradation. For example, a zirconia ceramic can be deposited over the material 402. In particular, the zirconia includes a yttria-stabilized zirconia. The ceramic nitride or oxynitride can be deposited over the rough material layer or the surface of the support material 402. For example, a silicon nitride can be deposited over the support material 402.

In particular, as illustrated in FIG. 5, a method 500 for forming a nuclear fuel rod includes forming a support material on a mandrel, as illustrated at 502. In particular, the support material can include elements of the zirconium alloy, either in a powdered form or in a sheet form. As illustrated at 504, the mandrel can be removed from the support material to form a tube that can be filled with a nuclear fuel, as illustrated at 506. Optionally, the tube can be sintered around the nuclear fuel, as illustrated at 508.

In an example, a rough material layer can be applied to the exterior facing surface of the tube, as illustrated at 510. In an example, a zirconium ceramic, such as a zirconia, for example, yttria stabilized zirconia, can be deposited on the exterior facing surface of the tube. In particular, the rough material layer can be deposited using chemical vapor deposition (CVD) or sputtering. In an example, the chemical vapor deposition (CVD) can include atmospheric pressure CVD, low-pressure CVD, ultra low-pressure CVD, flowable CVD, plasma enhanced CVD, or atomic layer CVD.

As illustrated at 512, a ceramic nitride or oxynitride can be applied over the rough material layer. In a particular example, the ceramic nitride includes silicon nitride. In an example, the ceramic nitride or oxynitride can be deposited using chemical vapor deposition (CVD). In an example, the chemical vapor deposition can include atmospheric pressure CVD, low-pressure CVD, ultra low-pressure CVD, flowable CVD, plasma enhanced CVD, or atomic layer CVD. In a particular example, the support material or rough material layer can be seeded with a surface treatment, for example, ammonia, followed by growth of the ceramic nitride or oxynitride using CVD. In particular, the CVD process can be repeated between 1 and 8 times to provide a desired layer thickness or to provide layers of different composition. In another example, ceramic nitride can be deposited using sputtering.

In other examples, a ceramic nitride or oxynitride layer, such as a transition metal nitride/oxynitride or semi-metal nitride/oxynitride, can be applied over components defining surfaces that have functionality within a structure or apparatus. For example, the ceramic nitride can be deposited over an exterior facing surface of a vehicle, defining a surface having friction that influences the performance of the vehicle, such as fuel efficiency. In another example, the ceramic nitride can be applied over an exterior facing surface of a transport container subject to a corrosive environment in which an unprotected support material would be subject to corrosion and a reduction in structural integrity. In a further example, the ceramic nitride, such as a semi-metal nitride, can be applied over the surfaces of parts or components of a machine that are subject to particle impact. The surfaces can define an exterior-facing surface or, in an example of a container, an interior-facing surface.

Figure 6:
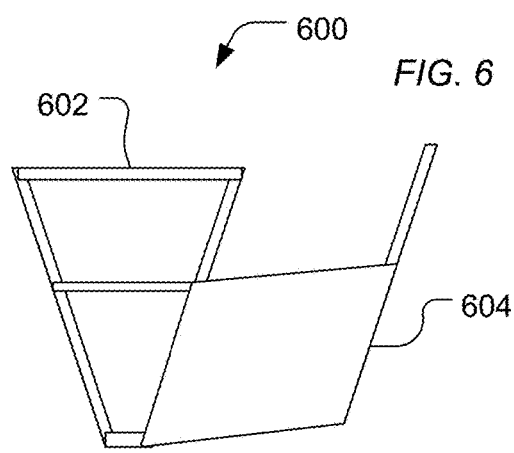
FIG. 6 includes an illustration of an exemplary vehicle or structure.

For example, as illustrated in FIG. 6, a vehicle 600, such as a car, truck, boat, or airplane, can include a frame 602 to which panels 604 are attached and define an exterior facing surface of the vehicle 600. An exterior facing surface of the panels 604 can include a ceramic nitride or oxynitride layer, such as a transition metal nitride or a semi-metal nitride. For example, the ceramic nitride can be a semi-metal nitride, such as a silicon nitride. In another example, the ceramic oxynitride includes aluminum oxynitride.

Figure 7:
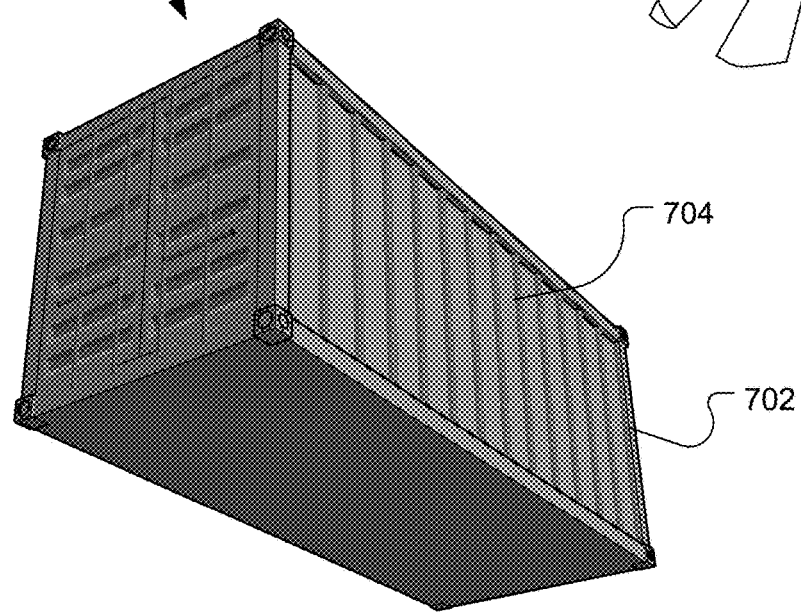
FIG. 7 includes an illustration of an exemplary shipping container.

In another example illustrated in FIG. 7, a transport container 700 can include panels 704 disposed on a structure 702. The panel 704 can include a ceramic nitride or oxynitride exterior facing surface, such as a silicon nitride or aluminum oxynitride exterior facing surface, disposed over a support material. Alternatively, the ceramic nitride or oxynitride can be formed on an interior facing surface of the container.

Figure 8:
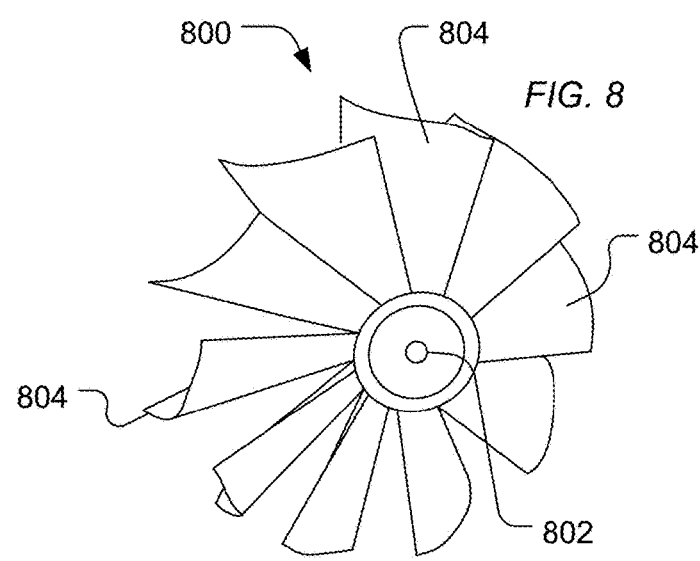
FIG. 8 includes an illustration of exemplary turbine blades.

In further example illustrated in FIG. 8, a machine component, such as a turbine 800, includes a central axis 802 and blades 804 surrounding and rotating around the central axis 802. In a particular example, the blades 804 can include an exterior surface defined by a ceramic nitride or oxynitride, such as a semi-metal nitride or oxynitride, disposed over a support material.

In a particular example, the ceramic nitrides or oxynitrides provide anti-corrosion or passivation properties to underlying supports. Such ceramic nitrides or oxynitrides can be used as exterior surfaces of vehicles, vessels, or containers. For example, aluminum oxynitride can be used as a coating for anti-corrosion and passivation of support materials of automobile bodies, marine vessels, nuclear materials including fuel rod cladding, or thermal barrier coating for aerospace. In particular, aluminum oxynitride can form anti-corrosion and transparent coating, for example, for a display surface.

The CVD techniques described herein provide thicker layers, can cover larger areas, and compensate for high surface roughness. In contrast to atomic layer deposition (ALD) using self-limiting precursors, the CVD deposition of ceramic nitride or oxynitride provides for a more consistent surface without pin holes. ALD conventionally uses self-limiting precursors and as such, can form holes when contaminants prevent nucleation of reagents. ALD can also have difficulty covering rough surfaces. CVD without the use of self-limiting precursors covers rough surfaces and does not leave holes. In particular reference to nuclear fuel rods, the above-described layers deposited by CVD can further limit high temperature steam from accessing Zircaloy surfaces and further limit the production of hydrogen.

Example 1

A silicon nitride film is formed over a Zircaloy surface using low pressure chemical vapor deposition.

The Zircaloy surface is seeded with ammonia. A SiN film is grown over the seeded Zircaloy surface using dichlorosilane and ammonia at a temperature in a range of 550° C. and 750° C. and a pressure in a range of 10 to 500 mTorr. The SiN film has a film thickness in a range of 1.1 to 1.2 micrometers.

The resulting SiN film does not exhibit pin-holes, exhibits desirable adhesion to the Zircaloy surface, and limits oxide growth on the Zircaloy.

Example 2

A silicon nitride film is formed over a Zircaloy surface using plasma enhanced chemical vapor deposition.

The Zircaloy surface is seeded with ammonia. A SiN film is grown over the seeded Zircaloy surface using dichlorosilane and ammonia at a temperature in a range of 250° C. and 450° C. and a pressure in a range of 10 to 0.001 Torr. SiN film growth is repeated in 4 to 6 stages to provide a film thickness in a range of 1.1 to 1.2 micrometers.

The resulting SiN film does not exhibit pin-holes, exhibits desirable adhesion to the Zircaloy surface, and limits oxide growth on the Zircaloy.

Example 3

A silicon nitride film is formed over a yttria-stabilized zirconia surface deposited over a Zircaloy surface using low pressure chemical vapor deposition.

A zirconia layer is deposited over a Zircaloy substrate using low pressure chemical vapor deposition. Organo-zirconium and organo-yttrium compounds (i.e. acetyl acetates) in the presence of oxygen are used in a low pressure chemical vapor deposition at a temperature of 550° C. to 750° C. and a pressure in a range of 10 to 500 mTorr The zirconia surface is seeded with ammonia. A SiN film is grown over the seeded zirconia surface using dichlorosilane and ammonia at a temperature in a range of 550° C. and 750° C. and a pressure in a range of 10 to 500 mTorr. The SiN film has a film thickness in a range of 1.1 to 1.2 micrometers.

The resulting SiN film does not exhibit pin-holes, exhibits desirable adhesion to the Zircaloy surface, and limits further oxide growth on the Zircaloy.

Example 4

A silicon nitride film is formed over a yttria-stabilized zirconia surface deposited over a Zircaloy surface using plasma enhanced chemical vapor deposition.

A zirconia layer is deposited over a Zircaloy substrate using low pressure chemical vapor deposition. Organo-zirconium and organo-yttrium compounds (i.e. acetyl acetates) in the presence of oxygen are used in a plasma enhanced chemical vapor deposition at a temperature in a range of 250° C. and 450° C. and a pressure in a range of 10 to 0.001 Torr.

The zirconia surface is seeded with ammonia. A SiN film is grown over the seeded zirconia surface using dichlorosilane and ammonia at a temperature in a range of 250° C. and 450° C. and a pressure in a range of 10 to 0.001 Torr. SiN film growth is repeated in 4 to 6 stages to provide a film thickness in a range of 1.1 to 1.2 micrometers.

The resulting SiN film does not exhibit pin-holes, exhibits desirable adhesion to the Zircaloy surface, and limits further oxide growth on the Zircaloy.

Based on the above examples, it is believed that those of skill in art can optimize the disclosed processes for depositing ceramic nitride or oxynitride layers of various composition and thickness.

In a first aspect, a nuclear fuel rod includes a container including a support material defining an exterior facing surface, a ceramic nitride or oxynitride disposed over the exterior facing surface; and a nuclear fuel disposed within the container.

In an example of the first aspect, the exterior facing surface has a roughness Ra in a range of 10 nm to 30 micrometers. For example, the roughness Ra is in a range of 10 nm to 25 micrometers, such as a range of 10 nm to 1 micrometer, a range of 10 nm to 500 nm, or a range of 50 nm to 350 nm. In another example, the roughness Ra is in a range of 5 micrometers to 25 micrometers, such as a range of 10 micrometers to 25 micrometers or a range of 15 micrometers to 25 micrometers.

In another example of the first aspect or the above examples, the nuclear fuel rod further includes a rough material layer disposed between the exterior facing surface of the support material and the ceramic nitride or oxynitride. For example, the rough material layer includes a crystalline material. In an example, the rough material layer includes a ceramic material. In a particular example, the ceramic material includes a transition metal ceramic, such as zirconia, for example, yttria-stabilized zirconia. In a further example, the rough material layer has a thickness in a range of 50 nm to 5 micrometers. For example, the thickness is in a range of 50 nm to 1 micrometer, such as a range of 50 nm to 500 nm or a range of 50 nm to 250 nm. In an additional example, the roughness Ra of the rough material layer is in a range of 10 nm to 1 micrometer. For example, wherein the roughness Ra of the rough material layer is in a range of 10 nm to 500 nm, such as a range of 50 nm to 350 nm.

In an additional example of the first aspect or the above examples, the ceramic nitride includes a transition metal nitride, such as titanium nitride.

In another example of the first aspect or the above examples, the ceramic nitride includes a semi-metal nitride. For example, the semi-metal nitride is silicon nitride, gallium nitride, germanium nitride, aluminum nitride, or a combination thereof. In an example, the semi-metal nitride is silicon nitride.

In an additional example of the first aspect or the above examples, the ceramic oxynitride includes aluminum oxynitride.

In a further example of the first aspect or the above examples, the ceramic nitride or oxynitride is an enriched ceramic nitride or oxynitride. For example, the enriched ceramic nitride or oxynitride includes 2% to 99.99% $^{15}$N.

In an additional example of the first aspect or the above examples, the support material includes aluminum, a transition metal, alloys thereof, or a combination thereof.

In another example of the first aspect or the above examples, the support material includes zirconium, tin, niobium, iron, chromium, nickel, hafnium, alloys thereof, or a combination thereof.

In a second aspect, a method of making a fuel rod includes forming tube of a support material, the support material defining an exterior facing surface and a tube cavity; loading a nuclear fuel into the tube cavity; and depositing a ceramic nitride or oxynitride over the exterior facing surface of the support material.

In an example of the second aspect, the method further includes sintering the support material. For example, sintering includes sintering following loading the nuclear fuel. In an additional example, sintering includes sintering prior to depositing the ceramic nitride or oxynitride.

In another example of the second aspect or the above examples, depositing includes depositing by chemical vapor deposition (CVD). For example, depositing by chemical vapor deposition includes depositing by atmospheric chemical vapor deposition, low pressure chemical vapor deposition, ultralow pressure chemical vapor deposition, flowable chemical vapor deposition, atomic layer chemical vapor deposition, or a combination thereof.

In a further example of the second aspect or the above examples, depositing includes sputtering.

In an additional example of the second aspect or the above examples, the ceramic nitride includes a transition metal nitride. For example, the transition metal nitride includes titanium nitride.

In another example of the second aspect or the above examples, the ceramic nitride includes a semi-metal nitride. For example, the semi-metal nitride is silicon nitride, gallium nitride, germanium nitride, aluminum nitride, or a combination thereof. In an example, the semi-metal nitride is silicon nitride.

In an additional example of the second aspect or the above examples, the ceramic oxynitride includes aluminum oxynitride.

In a further example of the second aspect or the above examples, the ceramic nitride or oxynitride is an enriched ceramic nitride. For example, the enriched ceramic nitride or oxynitride includes 2% to 99.99% $^{15}$N.

In an additional example of the second aspect or the above examples, the support material includes zirconium, tin, niobium, iron, chromium, nickel, hafnium, alloys thereof, or a combination thereof.

In another example of the second aspect or the above examples, the exterior facing surface has a roughness Ra in a range of 10 nm to 30 micrometers. For example, the roughness Ra is in a range of 10 nm to 25 micrometers, such as a range of 10 nm to 1 micrometer, a range of 10 nm to 500 nm, or a range of 50 nm to 350 nm. In an additional example, the roughness Ra is in a range of 5 micrometers to 25 micrometers, such as a range of 10 micrometers to 25 micrometers or a range of 15 micrometers to 25 micrometers.

In a further example of the second aspect or the above examples, the method further includes depositing a rough material layer prior to depositing the ceramic nitride or oxynitride. In an example, depositing the rough material layer includes depositing by chemical vapor deposition. In another example, the rough material layer is crystalline. In an alternative example, the rough material layer is amorphous. In an additional example, the rough material layer includes a ceramic material, such as zirconia, for example, yttria-stabilized zirconia. In a further example, the rough material layer has a thickness in a range of 50 nm to 5 micrometers. For example, the thickness is in a range of 50 nm to 1 micrometer, such as a range of 50 nm to 500 nm or a range of 50 nm to 250 nm. In an additional example, the roughness Ra of the rough material layer is in a range of 10 nm to 1 micrometer. For example, the roughness Ra of the rough material layer is in a range of 10 nm to 500 nm, such as a range of 50 nm to 350 nm.

In a third aspect, a vehicle includes a structural support; and a component comprising a support material defining an exterior facing surface and a ceramic nitride or oxynitride layer disposed over the support material.

In an example of the third aspect, the ceramic nitride or oxynitride layer forms a friction surface of the vehicle.

In another example of the third aspect or the above examples, the exterior facing surface has a roughness Ra in a range of 10 nm to 30 micrometers, such as a range of 10 nm to 25 micrometers. For example, the roughness Ra is in a range of 10 nm to 1 micrometer, such as a range of 5 micrometers to 25 micrometers.

In further example of the third aspect or the above examples, the vehicle further includes a rough material layer disposed between the exterior facing surface of the support material and the ceramic nitride or oxynitride. For example, the rough material layer includes a crystalline material. In another example, the rough material layer includes an amorphous material. In a further example, the rough material layer includes a ceramic material, such as a transition metal ceramic, for example, zirconia or yttria-stabilized zirconia. In additional example, the rough material layer has a thickness in a range of 50 nm to 5 micrometers, such as a range of 50 nm to 1 micrometer, a range of 50 nm to 500 nm, or a range of 50 nm to 250 nm. In another example, the roughness Ra of the rough material layer is in a range of 10 nm to 1 micrometer.

In an additional example of the third aspect or the above examples, the ceramic nitride includes a transition metal nitride, such as titanium nitride.

In another example of the third aspect or the above examples, the ceramic nitride includes a semi-metal nitride. For example, the semi-metal nitride is silicon nitride, gallium nitride, germanium nitride, aluminum nitride, or a combination thereof. In an example, the semi-metal nitride is silicon nitride.

In an additional example of the third aspect or the above examples, the ceramic oxynitride includes aluminum oxynitride.

In a further example of the third aspect or the above examples, the ceramic nitride or oxynitride is an enriched ceramic nitride or oxynitride. For example, the enriched ceramic nitride or oxynitride includes 2% to 99.99% $^{15}$N.

In an additional example of the third aspect or the above examples, the support material includes aluminum, a transition metal, alloys thereof, or a combination thereof. For example, the transition metal includes titanium, zirconium, hafnium, tin, niobium, iron, chromium, nickel, tantalum, tungsten, manganese, cobalt, copper, zinc, alloys thereof, or a combination thereof.

In another example of the third aspect or the above examples, the support material includes zirconium, tin, niobium, iron, chromium, nickel, hafnium, alloys thereof, or a combination thereof.

In a fourth aspect, a turbine includes an axle; and a plurality of blade disposed about the axle, each blade of the plurality of blades including a blade material defining an exterior facing surface and a ceramic nitride or oxynitride layer disposed over the blade material.

In an example of the fourth aspect, the exterior facing surface has a roughness Ra in a range of 10 nm to 30 micrometers. For example, the roughness Ra is in a range of 10 nm to 25 micrometers. In an example, the roughness Ra is in a range of 10 nm to 1 micrometer. In an additional example, the roughness Ra is in a range of 5 micrometers to 25 micrometers.

In another example of the fourth aspect or the above examples, the turbine further includes a rough material layer disposed between the exterior facing surface of the support material and the ceramic nitride or oxynitride. For example, the rough material layer includes a crystalline material. In another example, the rough material layer includes an amorphous material. In a further example, the rough material layer includes a ceramic material. For example, the ceramic material includes a transition metal ceramic, such as zirconia, for example, yttria-stabilized zirconia. In a further example, the rough material layer has a thickness in a range of 50 nm to 5 micrometers. In an additional example, the roughness Ra of the rough material layer is in a range of 10 nm to 1 micrometer.

In a further example of the fourth aspect or the above examples, the ceramic nitride includes a transition metal nitride.

In an additional example of the fourth aspect or the above examples, the ceramic nitride includes a semi-metal nitride. For example, the semi-metal nitride is silicon nitride, gallium nitride, germanium nitride, aluminum nitride, or a combination thereof. In an example, the semi-metal nitride is silicon nitride.

In an additional example of the fourth aspect or the above examples, the ceramic oxynitride includes aluminum oxynitride.

In another example of the fourth aspect or the above examples, the ceramic nitride or oxynitride is an enriched ceramic nitride or oxynitride. For example, the enriched ceramic nitride or oxynitride includes 2% to 99.99% $^{15}$N.

In a further example of the fourth aspect or the above examples, the support material includes aluminum, a transition metal, alloys thereof, or a combination thereof.

In an additional example of the fourth aspect or the above examples, the support material includes titanium, zirconium, hafnium, tin, niobium, iron, chromium, nickel, tantalum, tungsten, manganese, cobalt, copper, zinc, alloys thereof, or a combination thereof.

In another example of the fourth aspect or the above examples, the support material includes zirconium, tin, niobium, iron, chromium, nickel, hafnium, alloys thereof, or a combination thereof.

In a fifth aspect, a container including a plurality of walls, a wall of the plurality of walls formed of a support material and defining an exterior facing surface, a ceramic nitride or oxynitride layer disposed over the exterior facing surface.

In an example of the fifth aspect, the exterior facing surface has a roughness Ra in a range of 10 nm to 30 micrometers. For example, the roughness Ra is in a range of 10 nm to 25 micrometers, such as a range of 10 nm to 1 micrometer. In another example, the roughness Ra is in a range of 5 micrometers to 25 micrometers.

In another example of the fifth aspect or the above examples, the container further includes a rough material layer disposed between the exterior facing surface of the support material and the ceramic nitride or oxynitride. In an example the rough material layer includes a crystalline material. In an alternative example, the rough material layer includes a ceramic material. For example, the ceramic material includes a transition metal ceramic, such as zirconia, for example, yttria-stabilized zirconia. In another example, the rough material layer has a thickness in a range of 50 nm to 5 micrometers. In an additional example, the roughness Ra of the rough material layer is in a range of 10 nm to 1 micrometer.

In a further example of the fifth aspect or the above examples, the ceramic nitride includes a transition metal nitride. For example, the transition metal nitride includes titanium nitride.

In another example of the fifth aspect or the above examples, the ceramic nitride includes a semi-metal nitride. For example, the semi-metal nitride is silicon nitride, gallium nitride, germanium nitride, aluminum nitride, or a combination thereof. In an example, the semi-metal nitride is silicon nitride.

In an additional example of the fifth aspect or the above examples, the ceramic oxynitride includes aluminum oxynitride.

In a further example of the fifth aspect or the above examples, the ceramic nitride or oxynitride includes an enriched ceramic nitride or oxynitride. For example, the enriched ceramic nitride or oxynitride includes 2% to 99.99% $^{15}$N.

In an additional example of the fifth aspect or the above examples, the support material includes aluminum, a transition metal, alloys thereof, or a combination thereof.

In a further example of the fifth aspect or the above examples, the support material includes titanium, zirconium, hafnium, tin, niobium, iron, chromium, nickel, tantalum, tungsten, manganese, cobalt, copper, zinc, alloys thereof, or a combination thereof.

In a sixth aspect, a method of preparing a surface includes applying rough material layer to a surface of a support material, the rough material layer having a thickness in a range of 50 nm to 5 micrometers and a roughness Ra in a range of 10 nm to 1 micrometer; and depositing a ceramic nitride or oxynitride over the rough material layer.

In an example of the sixth aspect, the rough material comprises a crystalline material.

In another example of the sixth aspect or the above examples, depositing includes depositing by chemical vapor deposition (CVD). For example, depositing by chemical vapor deposition includes depositing by atmospheric chemical vapor deposition, low pressure chemical vapor deposition, ultralow pressure chemical vapor deposition, flowable chemical vapor deposition, atomic layer chemical vapor deposition, or a combination thereof.

In a further example of the sixth aspect or the above examples, depositing includes sputtering.

In an additional example of the sixth aspect or the above examples, the ceramic nitride includes a transition metal nitride. For example, the transition metal nitride includes titanium nitride.

In another example of the sixth aspect or the above examples, the ceramic nitride includes a semi-metal nitride. For example, the semi-metal nitride is silicon nitride, gallium nitride, germanium nitride, aluminum nitride, or a combination thereof. In an example, the semi-metal nitride is silicon nitride.

In an additional example of the sixth aspect or the above examples, the ceramic oxynitride includes aluminum oxynitride.

In a further example of the sixth aspect or the above examples, the ceramic nitride or oxynitride is an enriched ceramic nitride or oxynitride. For example, the enriched ceramic nitride or oxynitride includes 2% to 99.99% $^{15}$N.

In an additional example of the sixth aspect or the above examples, the support material includes aluminum, a transition metal, alloys thereof, or a combination thereof. For example, the support material includes titanium, zirconium, hafnium, tin, niobium, iron, chromium, nickel, tantalum, tungsten, manganese, cobalt, copper, zinc, alloys thereof, or a combination thereof. In another example, the support material includes zirconium, tin, niobium, iron, chromium, nickel, hafnium, alloys thereof, or a combination thereof.

In another example of the sixth aspect or the above examples, the surface has a roughness Ra in a range of 10 nm to 30 micrometers.

In an additional example of the sixth aspect or the above examples, applying the rough material layer includes depositing by chemical vapor deposition.

In another example of the sixth aspect or the above examples, the rough material layer is crystalline.

In a further example of the sixth aspect or the above examples, the rough material layer includes a ceramic material. For example, the ceramic includes zirconia, such as yttria-stabilized zirconia.

In an additional example of the sixth aspect or the above examples, the thickness of the rough material layer is in a range of 50 nm to 1 micrometer.

In another example of the sixth aspect or the above examples, the roughness Ra of the rough material layer is in a range of 10 nm to 500 nm.

As used herein, the terms "over," "above," "under," or "below" indicates an orientation of a layer or material relative to a normal to a surface of another layer or material and does not necessarily indicate, unless otherwise stated, that layers are in direct contact.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A turbine comprising:
   a central hub to rotate around an axis; and
   a plurality of blades connected to the central hub, each blade of the set of blades including a support material having an exterior facing surface and a ceramic nitride coating disposed over the exterior facing surface, a yttria-stabilized zirconia rough material layer disposed between the exterior facing surface of the support material and the ceramic nitride coating, the support material including aluminum, a transition metal, alloys thereof, or a combination thereof, the ceramic nitride coating comprising a semi-metal nitride is the external surface.

2. The turbine of claim 1, wherein the semi-metal nitride is silicon nitride, gallium nitride, germanium nitride, aluminum nitride, or a combination thereof.

3. The turbine of claim 2, wherein the semi-metal nitride is silicon nitride.

4. The turbine of claim 1, wherein the thickness of the ceramic nitride coating is in a range of 50 nm to 5 micrometers.

5. The turbine of claim 4, wherein the thickness of the ceramic nitride coating is in a range of 50 nm to 500 nm.

6. The turbine of claim 1, the transition metal includes titanium, zirconium, hafnium, tin, niobium, iron, chromium, nickel, tantalum, tungsten, manganese, cobalt, copper, zinc, alloys thereof, or a combination thereof.

7. The turbine of claim 1, wherein the support material comprises titanium.

8. The turbine of claim 1, wherein the rough material layer has a thickness in a range of 50 nm to 5 micrometers.

9. The turbine of claim 1, wherein the roughness Ra of the rough material layer is in a range of 10 nm to 1 micrometer.

10. The turbine of claim 9, wherein the roughness Ra of the rough material layer is in a range of 10 nm to 500 nm.

11. The turbine of claim 9, wherein the roughness Ra of the ceramic nitride coating is not greater than 50% and at least 0.1% of the roughness Ra of the surface of the rough material layer.

12. The turbine of claim 1, wherein the rough material layer has a thickness in a range of 50 nm to 5 micrometers.

13. The turbine of claim 12, wherein the thickness is in a range of 50 nm to 1 micrometer.

* * * * *